United States Patent
Degtiarenko et al.

(10) Patent No.: US 7,911,278 B1
(45) Date of Patent: Mar. 22, 2011

(54) BIASED LOW DIFFERENTIAL INPUT IMPEDANCE CURRENT RECEIVER/CONVERTER DEVICE AND METHOD FOR LOW NOISE READOUT FROM VOLTAGE-CONTROLLED DETECTORS

(75) Inventors: Pavel V. Degtiarenko, Williamsburg, VA (US); Vladimir E. Popov, Newport News, VA (US)

(73) Assignee: Jefferson Science Associates, LLC, Newport News, VA (US)

(*) Notice: Subject to any disclaimer, the term of this patent is extended or adjusted under 35 U.S.C. 154(b) by 279 days.

(21) Appl. No.: 12/220,764

(22) Filed: Jul. 28, 2008

(51) Int. Cl.
*H03F 3/08* (2006.01)

(52) U.S. Cl. .................................. 330/308; 250/214 A

(58) Field of Classification Search ............ 330/308; 250/214 A
See application file for complete search history.

(56) References Cited

U.S. PATENT DOCUMENTS

| 5,089,788 A * | 2/1992 | Shiga ............................. 330/59 |
| 6,574,022 B2 * | 6/2003 | Chow et al. .................... 398/202 |
| 6,995,615 B2 * | 2/2006 | Zhao ............................. 330/308 |
| 2007/0152136 A1 * | 7/2007 | Yao et al. .................. 250/214 A |

\* cited by examiner

*Primary Examiner* — Henry K Choe

(57) ABSTRACT

A first stage electronic system for receiving charge or current from voltage-controlled sensors or detectors that includes a low input impedance current receiver/converter device (for example, a transimpedance amplifier), which is directly coupled to the sensor output, a source of bias voltage, and the device's power supply (or supplies), which use the biased voltage point as a baseline.

2 Claims, 3 Drawing Sheets

US 7,911,278 B1

BIASED LOW DIFFERENTIAL INPUT IMPEDANCE CURRENT RECEIVER/CONVERTER DEVICE AND METHOD FOR LOW NOISE READOUT FROM VOLTAGE-CONTROLLED DETECTORS

The United States of America may have certain rights to this invention under Management and Operating Contract DE-AC05-06OR23177 from the United States Department of Energy.

FIELD OF THE INVENTION

The present invention relates to low input impedance current receiver/converter devices and more particularly to such devices used as an input stage for voltage-controlled detectors such as photomultipliers, semiconductor detectors including photodiodes of different types, and silicon photomultipliers. A transimpedance amplifier (charge or current to voltage converter) device may serve as a particular implementation of such low input impedance amplifier device.

BACKGROUND OF THE INVENTION

Voltage-controlled detectors such as ionization chambers, photomultipliers, semiconductor detectors including photodiodes of different types, silicon photomultipliers, etc., require a voltage difference applied between the grounded parts of the detector and the sensor output line; the electrical current or charge in such line is the measure of the signal. The condition of stable operation of the voltage-controlled detectors is such that the voltage applied to the sensor output line should remain constant and independent of the sensor's output current, which is equivalent to having a low differential input impedance (dV/dI) of the input circuit of the amplifier cascade connected to it.

A schematic of traditional first stage of the amplification cascade for voltage-controlled detectors is shown in FIG. 1. Shown in FIG. 1 is such a system 10 wherein 12 is the applied operational voltage for the detector 36, 34 is the sensor output line, 30 is the operational amplifier, providing signal output 32, with its power supply lines 26 and 28, and feedback chain impedances 22 and 24. The traditional schematics include a power circuit (load) resistor 14, a decoupling input capacitor 16, input capacitance 18, and an input resistance 20 for the amplifier circuit. These elements present sources of extra noise and extra frequency-dependent signal distortions that ultimately affect the accuracy of the readings. There thus remains a need for a low noise readout circuit for voltage-controlled detectors.

OBJECT OF THE INVENTION

It is therefore an object of the present invention to provide a lower noise readout circuit for voltage-controlled detectors.

SUMMARY OF THE INVENTION

According to the present invention there is provided a first stage electronic system for receiving signals from voltage-controlled sensors or detectors that includes a low differential input impedance current receiver/converter device, which is directly coupled to the sensor output, a source of bias voltage, and the receiver/converter power supply (or supplies), which use the biased voltage point as a baseline.

DETAILED DESCRIPTION

Figure 1:
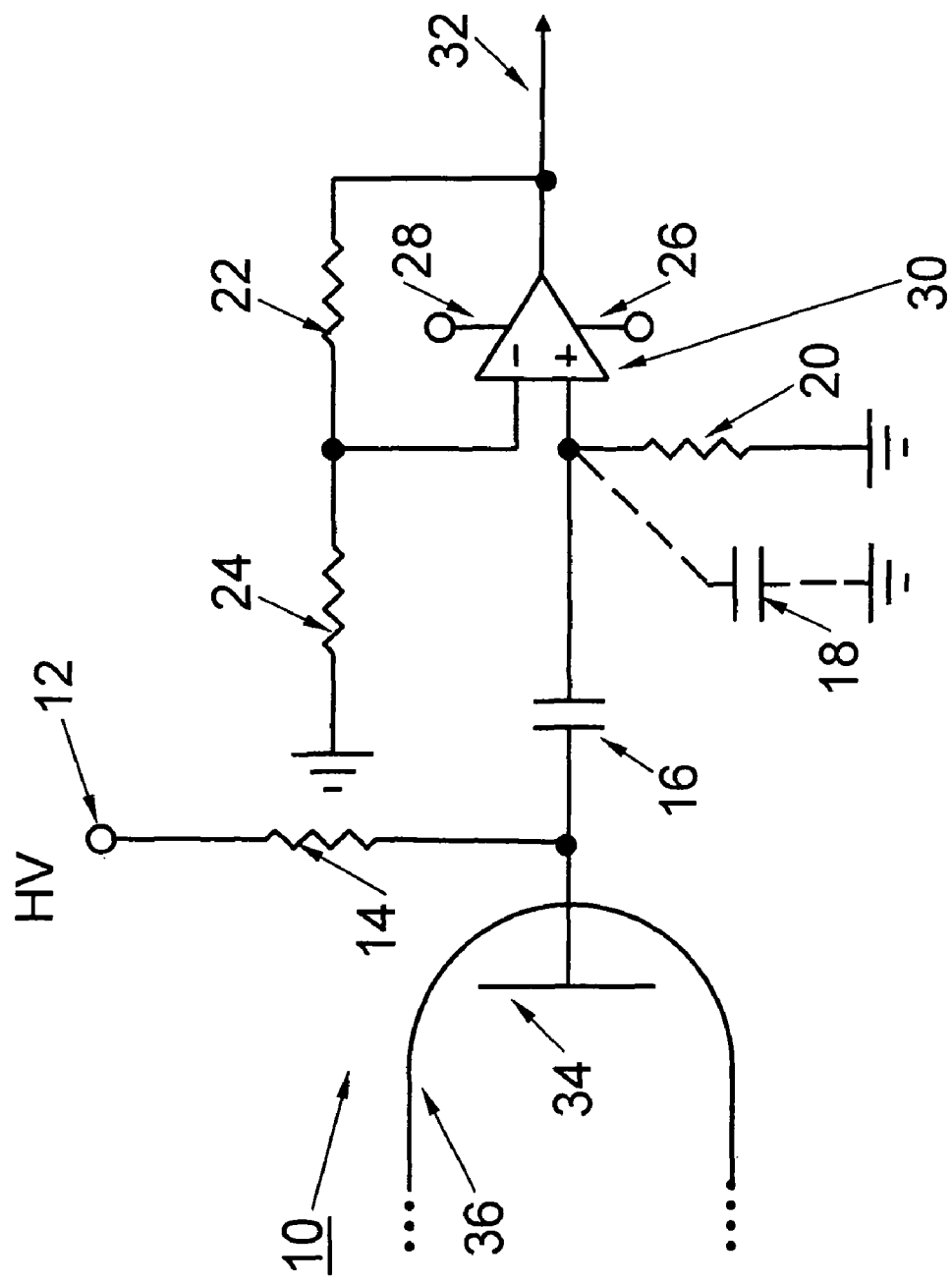
FIG. 1 is a schematic diagram of the prior art first stage circuit for the receiving and amplification of voltage-controlled detector signals.
Figure 2:
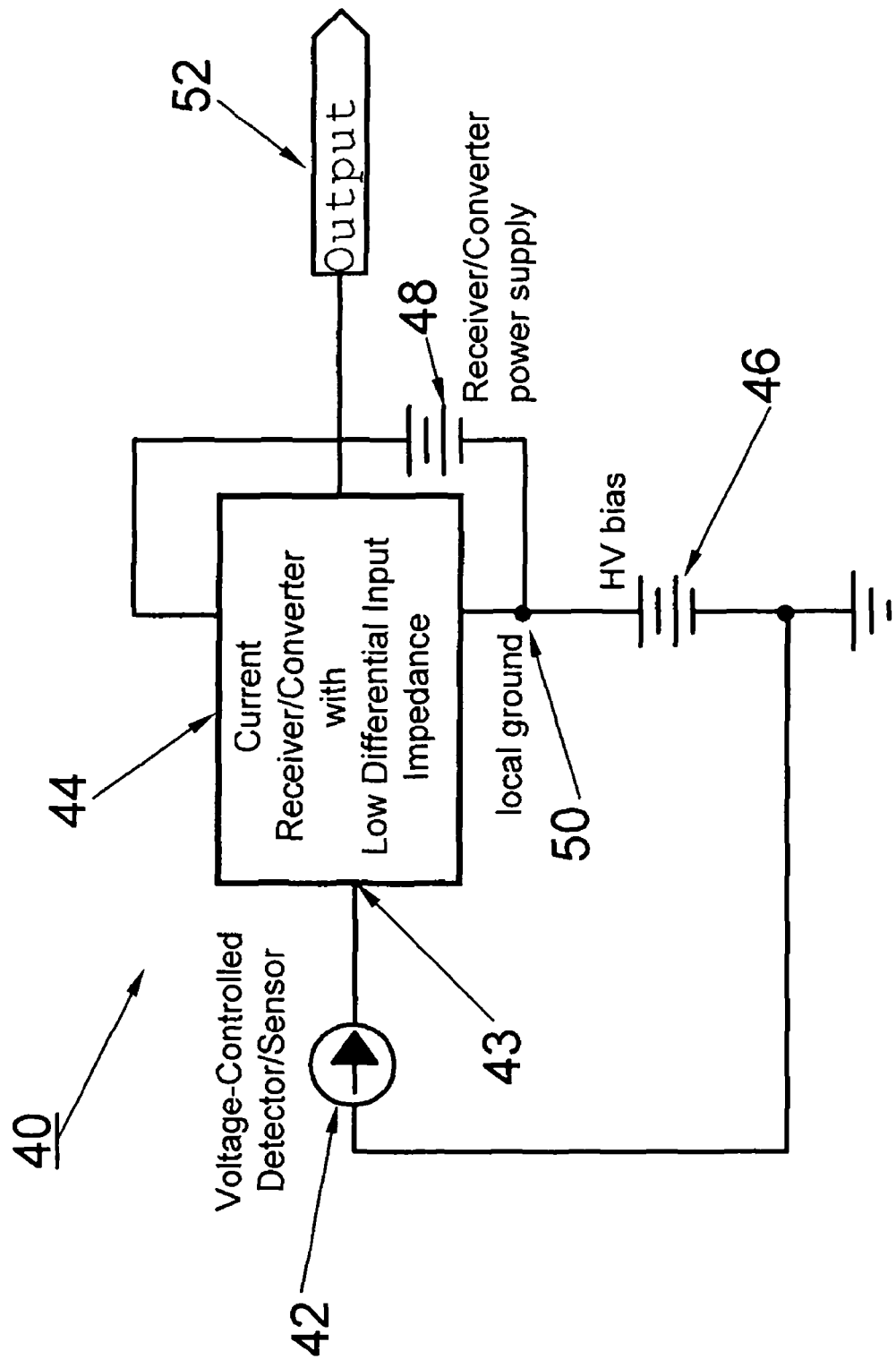
FIG. 2 is a schematic diagram of the low differential input impedance biased first stage current receiver/converter for the receiving and amplification of voltage-controlled detector signals in accordance with the present invention.

Referring now to the accompanying drawings, FIG. 2 is a schematic diagram of the circuit of the present invention. As shown in FIG. 2 the circuit of the present invention 40 wherein 42 represents the detector/sensor as a current source directly connected to the input port 43 of the current receiver/converter with low differential input impedance 44 comprises a source of bias voltage 46 connected to the local ground 50 of circuit 44 to which the receiver/converter power supply 48 is also connected. The output line 52 represents the result of the detector current conversion as performed by the circuit 44, in the form of electric voltage, electric current, radio-frequency signal, emitted light, or other form. In the framework of the present invention the internal structure and complexity of the circuit 44 doesn't have to be specified; the only condition for the circuit 44 is such that the differential input impedance dV/dI is small. That is, the change of voltage between the input 43 and the local ground 50 of the circuit 44 should remain small, compared to the voltage across the detector that controls its operation, over the range of currents expected to be delivered by the sensor's output. The source of the bias voltage 46 then is used to fine-tune the detector/sensor control voltage to provide its optimal and stable operation. The direct coupling of sensor 42 output to the input port 43 of the circuit 44 provides the opportunity to collect all sensor current or charge if the inner design of the circuit 44 contains no parasitic or noise-generating components.

Figure 3:
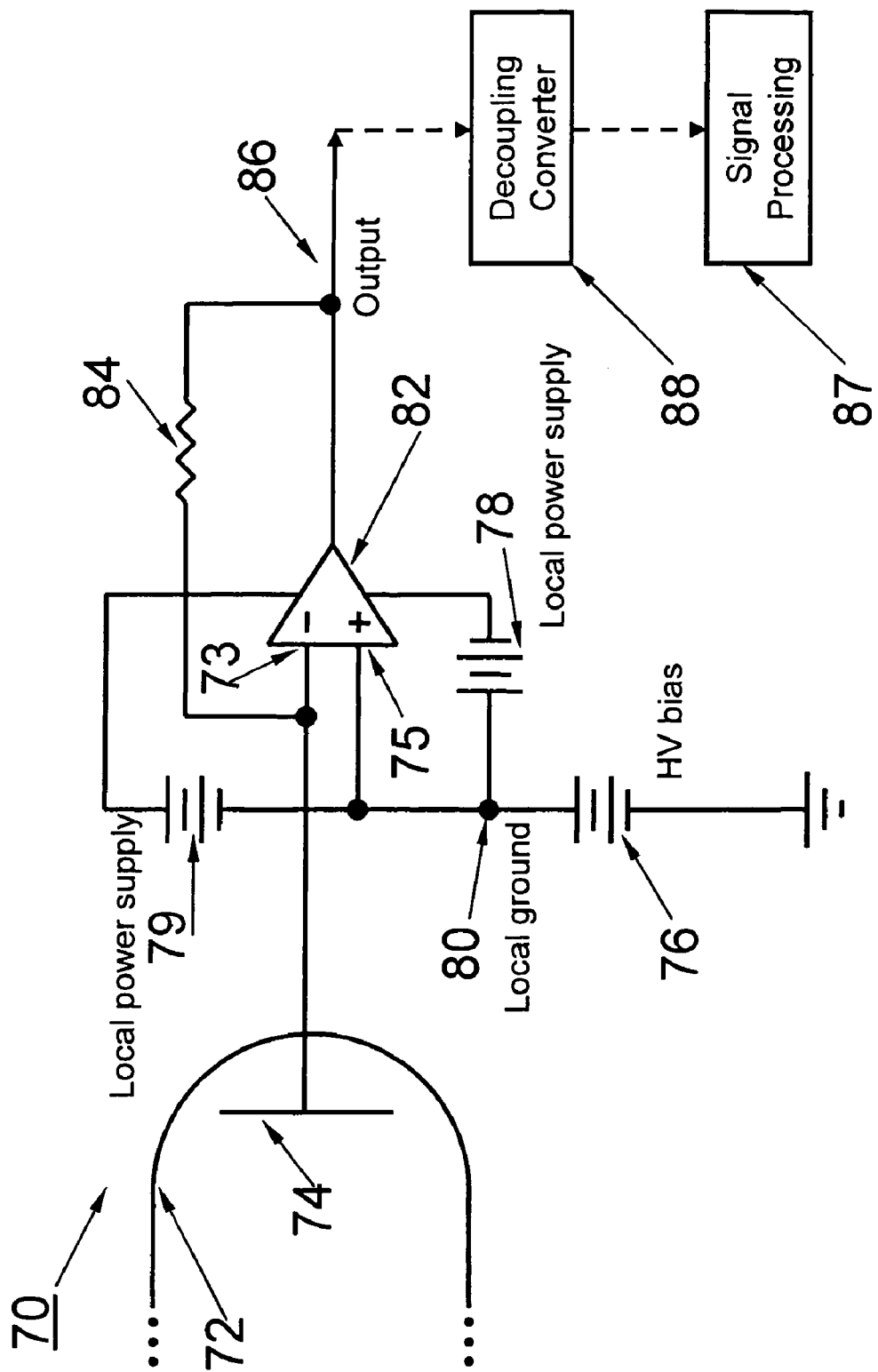
FIG. 3 is a schematic diagram of the preferred embodiment of the present invention including a transimpedance biased first stage amplifier for the receiving and amplification of voltage-controlled detector signals.

FIG. 3 is a schematic diagram of the preferred embodiment of the present invention utilizing a transimpedance amplifier (charge or current to voltage converter) as the element suitable for such low-noise readout circuit for voltage-controlled detectors. As shown in FIG. 3 the low noise preferred embodiment circuit of the present invention 70 wherein the output line 74 of the detector/sensor 72 is directly connected to the inverting port 73 of the operational amplifier 82 comprises a source of bias voltage 76 connected to the local ground 80 of circuit 70 to which the amplifier power supplies 78 and 79 and direct amplifier port 75 are in turn connected. Feed back impedance 84 determining overall gain is located between the amplifier output 86 and the inverting port 73. Thus, the bias voltage determines the control voltage at the connection of 73 and 74 so as to make the detector/sensor operational. Some amplifiers 82 may require only a single power supply, in which case the circuit 70 of the present invention would still operate satisfactorily.

The direct coupling of sensor output line 74 to the input of the transimpedance amplifier 82 provides an opportunity to collect all sensor output current or charge in amplifier 82 and produce an output signal with exceptionally good signal to noise ratio. A system front-end with direct coupling contains no parasitic components which can add noise or diminish signal.

Biasing of input line 74 utilizes the property of the transimpedance amplifiers to keep the voltage at their input line constant with respect to the local ground and the integrated circuit's power supply voltages. The biased voltage point serves as a local ground for the transimpedance amplifier, and the amplifier power supply sources 78 and 79 are built on top of it. The biasing voltage source is used in circuit 70 to offset local ground and the supply voltages to the level needed for reliable operation of the detector/sensor 72.

The output signals from amplifier 82 are biased accordingly. If the value of the bias exceeds the capabilities to accept the signal by the subsequent signal processing hardware 87 (such as Amplitude-to-Digital Converters, extra amplification or signal shaping cascades), then an optional signal-decoupling converter 88 can be used to produce floating output signal. The advantage of this arrangement is that the decoupling of the signal at a later stage of amplification introduces significantly less noise and signal distortion compared to signal decoupling before the first stage, as it is done customarily in prior art devices.

As the effective input impedance of the transimpedance amplifier is close to zero, measures to limit the input current should be implemented in practical designs, such as regular current-limiting circuits in the amplifier, or in the source of the bias voltage.

The practical use of the circuit of the present invention is in a new generation of high dynamic range and low noise radiation detectors, where the conditions of the direct coupling of the detector output to the amplifier circuit are desirable, and where it is advantageous to keep the detector output line at a voltage different from ground level voltage.

There have been described a biased low differential input impedance current receiver/converter circuit, and a biased transimpedance amplifier circuit that provides a lower noise readout circuit for voltage-controlled detectors/sensors.

As the invention has been described, it will be apparent to those skilled in the art that the same may be varied in many ways without departing from the intended spirit and scope of the invention, and any and all such modifications are intended to be included within the scope of the appended claims.

What is claimed is:

1. A low noise implementation of a first stage electronic system for measuring currents and receiving signals from voltage-controlled sensors or detectors comprising:
   A) a current receiver/converter having low differential input impedance; said receiver/convertor comprising a transimpedance charge or voltage amplifier having an inverting port, a direct amplifier port, a local ground, an output port, and a feedback impedance located between the inverting port and the output port, said detector or sensor being connected to the inverting port; said local ground of the receiver/converter being connected to the direct amplifier port;
   B) a voltage-controlled detector or sensor having its grounded parts galvanically connected to the device ground, and its output line connected to said inverting port of said receiver/converter, providing current to said inverting port of said receiver/converter;
   C) a power supply circuit providing a bias voltage between said device ground and said local ground of the receiver/converter, thereby supplying the voltage necessary to control the detector or sensor upon equalization of the constant voltage levels at the local ground and said inverting port of the receiver/converter; and
   D) an output line connected to said output port supplying the result of detector or sensor current conversion in an appropriate form.

2. A low noise implementation of a first stage electronic system for measuring currents and receiving signals from voltage-controlled sensors or detectors comprising:
   A) a current receiver/converter having low differential input impedance; said receiver/convertor including an input port, an output port, and a local ground; said current/receiver having the constant voltage level at said input port equalized with the constant voltage level at said local ground;
   B) a voltage-controlled detector or sensor having its grounded parts galvanically connected to the device ground, and its output line connected to said input port of said receiver/converter, providing current to said input port of said receiver/converter;
   C) a power supply circuit providing a bias voltage between said device ground and said local ground of the receiver/converter, thereby supplying the voltage necessary to control the detector or sensor upon equalization of the constant voltage levels at the local ground and said input port of the receiver/converter;
   D) an output line connected to said output port supplying the result of detector or sensor current conversion in an appropriate form; and
   E) signal processing hardware and software connected to the output port, and a decoupling converter connected between the output port and the signal processing hardware and software.

* * * * *